United States Patent
Collier-Hallman et al.

(10) Patent No.: US 12,193,161 B2
(45) Date of Patent: Jan. 7, 2025

(54) REDUNDANT PRINTED CIRCUIT BOARD WITH BUILT IN ISOLATION

(71) Applicant: STEERING SOLUTIONS IP HOLDING CORPORATION, Saginaw, MI (US)

(72) Inventors: Steven J. Collier-Hallman, Frankenmuth, MI (US); Daniel J. Klenk, Saginaw, MI (US); Ryan D. Yaklin, Chesaning, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 670 days.

(21) Appl. No.: 17/331,553

(22) Filed: May 26, 2021

(65) Prior Publication Data
US 2021/0378097 A1    Dec. 2, 2021

Related U.S. Application Data

(60) Provisional application No. 63/033,163, filed on Jun. 1, 2020.

(51) Int. Cl.
| | |
|---|---|
| *H05K 1/00* | (2006.01) |
| *B62D 15/02* | (2006.01) |
| *H05K 1/02* | (2006.01) |
| *H05K 1/18* | (2006.01) |
| *B62D 5/04* | (2006.01) |

(52) U.S. Cl.
CPC .............. *H05K 1/18* (2013.01); *B62D 15/02* (2013.01); *H05K 1/0277* (2013.01); *B62D 5/04* (2013.01); *H05K 2201/09009* (2013.01); *H05K 2201/1009* (2013.01); *H05K 2201/10151* (2013.01)

(58) Field of Classification Search
CPC .................. H05K 1/18; H05K 1/0277; H05K 2201/09009; H05K 2201/1009; H05K 2201/10151; B62D 15/02; B62D 5/04
See application file for complete search history.

(56) References Cited

U.S. PATENT DOCUMENTS

| | | | |
|---|---|---|---|
| 10,396,038 B2* | 8/2019 | Cheah | H01L 23/5387 |
| 2012/0267154 A1* | 10/2012 | Sass | H01R 12/585 |
| | | | 29/874 |
| 2013/0087375 A1* | 4/2013 | Tsunoi | H05K 1/0278 |
| | | | 174/250 |

(Continued)

FOREIGN PATENT DOCUMENTS

| | | | | |
|---|---|---|---|---|
| DE | 102018218375 A1 * | 5/2019 | | B62D 5/0406 |

OTHER PUBLICATIONS

JP 2009117501A English Translation ; filed on Nov. 5, 2007 (Year: 2019).*
JP 2019090471 A (Year: 2019).*

*Primary Examiner* — Pete T Lee
(74) *Attorney, Agent, or Firm* — Dickinson Wright PLLC

(57) ABSTRACT

An apparatus for an electronic power steering system includes a printed circuit board and a first sensor. The printed circuit board comprising: a first surface and a second surface opposite the first surface; a first processor section extending in a first direction on the first surface; a second processor section extending in a second direction opposite the first direction on the second surface; and a void disposed between the first surface and the second surface, the first processor section and the second processor section being separated by the void.

20 Claims, 6 Drawing Sheets

(56) References Cited

U.S. PATENT DOCUMENTS

| | | | |
|---|---|---|---|
| 2015/0048463 A1* | 2/2015 | Chiang | B81C 1/0023 257/417 |
| 2015/0163913 A1* | 6/2015 | Jo | H01L 25/105 361/772 |
| 2019/0067245 A1* | 2/2019 | Kinsley | H01L 25/0657 |

* cited by examiner

REDUNDANT PRINTED CIRCUIT BOARD WITH BUILT IN ISOLATION

CROSS-REFERENCES TO RELATED APPLICATIONS

This patent application claims priority to U.S. Provisional Patent Application Ser. No. 63/033,163, filed Jun. 1, 2020 which is incorporated herein by reference in its entirety.

TECHNICAL FIELD

This disclosure relates to printed circuit boards and in particular to redundant printed circuit boards having built in processing unit isolation.

BACKGROUND OF THE INVENTION

Vehicles, such as cars, trucks, sport utility vehicles, crossovers, mini-vans, or other suitable vehicles, typically include power steering features, such as an electronic power steering (EPS) system. The EPS system is typically configured to provide a steering assist to an operator of a corresponding vehicle. For example, the EPS system may be configured to apply an assist torque to an electric motor, which is connected to a steering mechanism. As the operator interacts with a handwheel or steering wheel associated with the steering mechanism, the amount of force or torque applied by the operator on the handwheel or steering wheel is assisted (e.g., reducing amount of force or torque required by the operator to perform a corresponding steering maneuver) by the electric motor.

Increasingly, such steering systems are requiring redundancy features to prevent or mitigate loss of steering assist. Further, there is an increasing need to use redundant processors with isolation between such processors. The may include using separate circuit boards and an interconnection system to allow the processors to communicate, which may increase costs due to additionally hardware components being used. Additionally, in steering systems where a motor position sensor system includes multiple sensors on the end of the motor shaft, the sensor system may require one or more additional circuit boards or means of mounting and connecting the sensor system.

SUMMARY OF THE INVENTION

This disclosure relates generally to electronic and processing components for electronic power steering systems.

An aspect of the disclosed embodiments includes an apparatus. The apparatus includes a printed circuit board having: a first surface and a second surface opposite the first surface; a first processor section extending in a first direction on the first surface; a second processor section extending in a second direction opposite the first direction on the second surface; and a void disposed between the first surface and the second surface, the first processor section and the second processor section being separated by the void. The apparatus may also include a first sensor disposed on a portion of one of the first processor section and the second processor section corresponding to the void.

Another aspect of the disclosed embodiments includes a printed circuit board. The printed circuit board includes a first surface and a second surface opposite the first surface. The printed circuit board also includes a first processor section extending in a first direction on the first surface and a second processor section extending in a second direction opposite the first direction on the second surface. The printed circuit board also includes a void disposed between the first surface and the second surface, the first processor section and the second processor section being separated by the void and defining a flexible section comprising at least one layer of dielectric material and at least one layer of conductive material. The printed circuit board may also include a first sensor disposed on a portion of one of the first processor section and the second processor section corresponding to the void.

Another aspect of the disclosed embodiments includes a steering system for a vehicle. The steering system includes a printed circuit board having: a first surface and a second surface opposite the first surface; a first processor section extending in a first direction on the first surface; a second processor section extending in a second direction opposite the first direction on the second surface; and a void disposed between the first surface and the second surface, the first processor section and the second processor section being separated by the void and defining a flexible section comprising at least one layer of dielectric material and at least one layer of conductive material. The steering system also includes a position sensor disposed on a portion of one of the first processor section and the second processor section corresponding to the void, the position sensor being configured to measure a positon of an associated motor.

Another aspect of the disclosed embodiments includes a steering system for a vehicle. The steering system includes a printed circuit board having: a first surface and a second surface opposite the first surface; a first processor section extending in a first direction on the first surface; a second processor section extending in a second direction opposite the first direction on the second surface; and an isolation area comprising a slot disposed in the first surface and extending through the second surface, the first processor section and the second processor section being separated by the isolation area, the isolation area defining a flexible section comprising at least one layer of dielectric material and at least one layer of conductive material.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
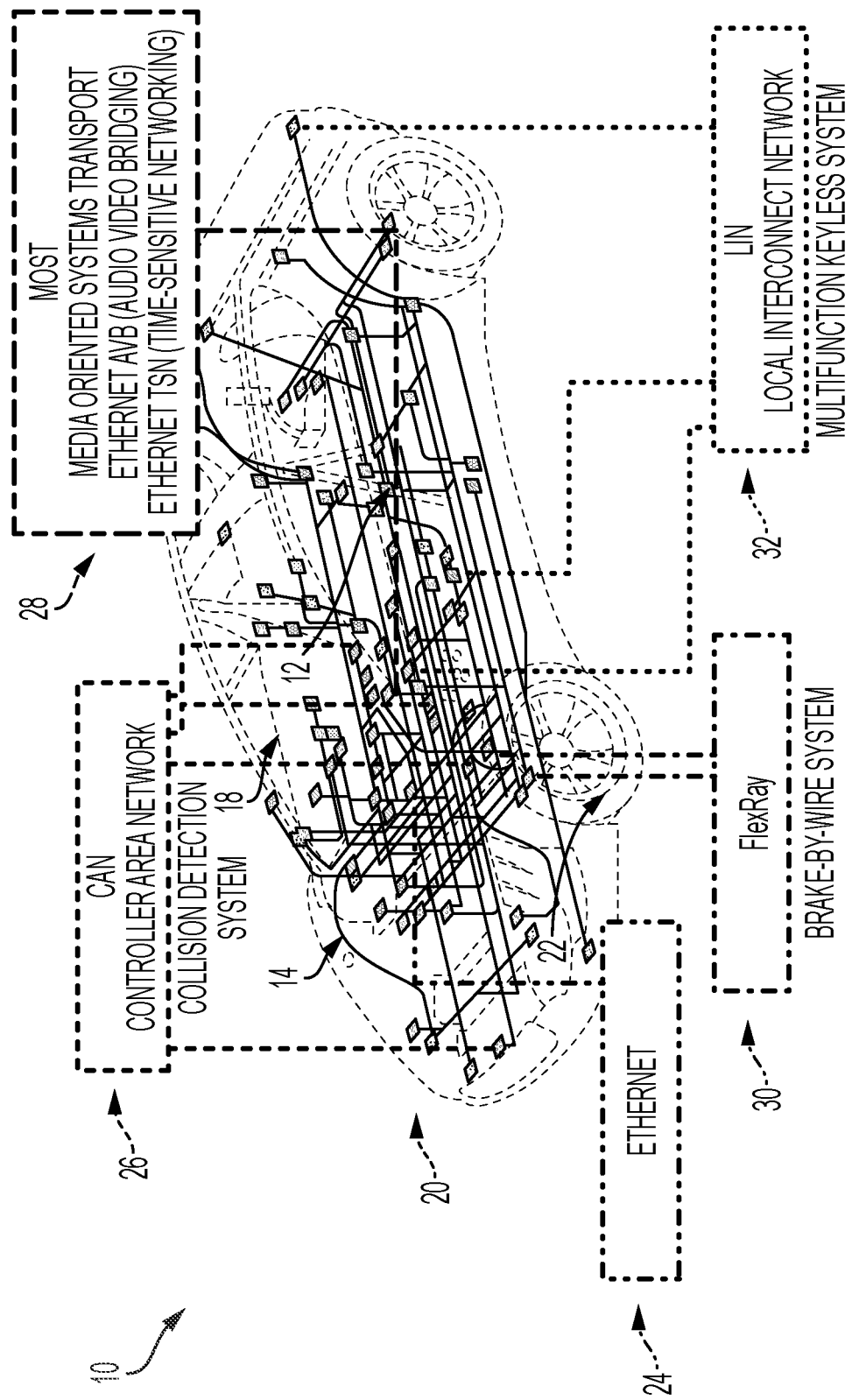
FIG. 1 generally illustrates a vehicle according to the principles of the present disclosure.

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, vehicles, such as cars, trucks, sport utility vehicles, crossovers, mini-vans, or other suitable vehicles, typically include power steering features, such as an electronic power steering (EPS) system. The EPS system is typically configured to provide a steering assist to an operator of a corresponding vehicle. For example, the EPS system may be configured to apply an assist torque to an electric motor, which is connected to a steering mechanism. As the operator interacts with a handwheel or steering wheel associated with the steering mechanism, the amount of force or torque applied by the operator on the handwheel or steering wheel is assisted (e.g., reducing amount of force or torque required by the operator to perform a corresponding steering maneuver) by the electric motor.

Typically, EPS systems include various redundant features to prevent loss of the assist to the operator. Increasingly, there is a demand for such EPS systems to include redundant processors (e.g., or processor units) with isolation between different processors, which may include separate circuit boards and an interconnection system to allow the redundant processors to communicate. This typically increases manufacturing and production cost (e.g., due to the additional circuit boards and the interconnection system).

Additionally, in EPS systems where a motor position sensor system consists of multiple sensors on the end of an associated motor shaft, the motor position sensor system may require one or more additional circuit boards and/or means of mounting and connecting the sensor system.

Accordingly, systems and method, such as those described herein, configured to reduce the number of required circuit boards and interconnection systems of an EPS, may be desirable. In some embodiments, the systems and methods described herein may be configured to place multiple processors, inter-processor communication circuitry, and/or a motor position sensor on one printed circuit board.

In some embodiments, the systems and methods described herein may be configured to provide isolation between the processors by providing circuity for each processor that has a distinct area allocation on the printed circuit board for each respective processor. The systems and methods described herein may be configured to circuitry for each processor that allows each processor to occupy both sides of the printed circuit board as long as each processor operates within a defined area.

In some embodiments, the systems and methods described herein may be configured to mechanical isolation by providing a void area between the processors and between the top and bottom of the printed circuit board. The void may include air, a vacuum, an elastomer, a foam, any other suitable material, or a combination thereof for creating the isolation.

In some embodiments, the systems and methods described herein may be configured to provide, using the void, at least two flexible sections of the printed circuit board that may be used for inter-processor communication, motor position sensing, any non-critical or circuitry common to the separate processor, or a combination thereof. The systems and methods described herein may be configured to use the at least two flexible sections to creates redundancy with mechanical isolation for the sensing and communication systems. While only two processors are described, the systems and methods described herein may including proving any suitable number of processors and corresponding voids associated therewith.

In some embodiments, the systems and methods described herein may be configured to reduce manufacturing costs and reduce reliability issues associated with separately assembled interconnection systems, while providing motor position sensing without additional circuit boards. The systems and methods described herein may be configured to provide a convenient location for any isolation circuitry that may be associated with the inter-processor communication system.

In some embodiments, the systems and methods described herein may be configured to at least one of the sections may be dedicated to a first processor and the other section may be dedicated to a second processor. In some embodiments, the systems and methods described herein may be configured to include additional processors by including additional void areas (e.g., additional void areas in the plan view of the printed circuit board and/or additional voids in an elevation view of the printed circuit board.

In some embodiments, the systems and methods described herein may be configured to allow for diversity between the first processor and the second processor, which may provide improved safety features. For example, the first processor and the second processor may include similar or substantially similar processors, the first processor and the second processor can include substantially different processors, or the first processor and the second processor may include processors having some similarities and/or differences.

In some embodiments, the systems and methods described herein may be configured to include a printed circuit board and a first sensor. The printed circuit board may include a first surface and a second surface opposite the first surface. The printed circuit board may also include a first processor section extending in a first direction on the first surface. The printed circuit board may also include a second processor section extending in a second direction opposite the first direction on the second surface. The printed circuit board may also include a void disposed between the first surface and the second surface. In some embodiments, the first processor section and the second processor section may be separated by the void. The first sensor may be disposed on a portion of one of the first processor section and the second processor section corresponding to the void.

In some embodiments, the void defines a flexible section of the printed circuit board. In some embodiments, the void comprises one or more of air, a vacuum, an elastomer material, and a foam material. In some embodiments, the first sensor includes a position sensor. In some embodiments, the apparatus also includes a second sensor disposed on a portion of the other of the first processor section and the second processor section corresponding to the void. In some embodiments, a portion of the void defined by the first surface includes at least one dielectric layer of the printed circuit board. In some embodiments, a portion of the void defined by the second surface includes at least one dielectric layer of the printed circuit board. In some embodiments, the printed circuit board includes an eight layer printed circuit board.

In some embodiment, the systems and methods described herein may be configured to provide improvement to EPS systems that reduce manufacturing and production costs and reliability issues associated with separately assembled interconnection systems. The systems and methods described herein may be allow motor position sensing to occur without adding additional printed circuit boards. The systems and methods described herein may be configured to provide a convenient location for any isolation circuitry that may be present in the inter-processor communication system.

In some embodiments, the systems and methods described herein may be configured to encourage diversity between the processors of the printed circuit board, which may provide for additional safety benefits. In some embodiments, all of the components are on one printed circuit board and the processors may have diverse layouts.

FIG. 1 generally illustrates a vehicle 10 according to the principles of the present disclosure. The vehicle 10 may include any suitable vehicle, such as a car, a truck, a sport utility vehicle, a mini-van, a crossover, any other passenger vehicle, any suitable commercial vehicle, or any other suitable vehicle. While the vehicle 10 is illustrated as a passenger vehicle having wheels and for use on roads, the principles of the present disclosure may apply to other vehicles, such as planes, boats, trains, drones, or other suitable vehicles.

The vehicle 10 includes a vehicle body 12 and a hood 14. A passenger compartment 18 is at least partially defined by the vehicle body 12. Another portion of the vehicle body 12 defines an engine compartment 20. The hood 14 may be moveably attached to a portion of the vehicle body 12, such that the hood 14 provides access to the engine compartment 20 when the hood 14 is in a first or open position and the hood 14 covers the engine compartment 20 when the hood 14 is in a second or closed position. In some embodiments, the engine compartment 20 may be disposed on rearward portion of the vehicle 10 than is generally illustrated.

The passenger compartment 18 may be disposed rearward of the engine compartment 20, but may be disposed forward of the engine compartment 20 in embodiments where the engine compartment 20 is disposed on the rearward portion of the vehicle 10. The vehicle 10 may include any suitable propulsion system including an internal combustion engine, one or more electric motors (e.g., an electric vehicle), one or more fuel cells, a hybrid (e.g., a hybrid vehicle) propulsion system comprising a combination of an internal combustion engine, one or more electric motors, and/or any other suitable propulsion system.

In some embodiments, the vehicle 10 may include a petrol or gasoline fuel engine, such as a spark ignition engine. In some embodiments, the vehicle 10 may include a diesel fuel engine, such as a compression ignition engine. The engine compartment 20 houses and/or encloses at least some components of the propulsion system of the vehicle 10. Additionally, or alternatively, propulsion controls, such as an accelerator actuator (e.g., an accelerator pedal), a brake actuator (e.g., a brake pedal), a steering wheel, and other such components are disposed in the passenger compartment 18 of the vehicle 10. The propulsion controls may be actuated or controlled by a driver of the vehicle 10 and may be directly connected to corresponding components of the propulsion system, such as a throttle, a brake, a vehicle axle, a vehicle transmission, and the like, respectively. In some embodiments, the propulsion controls may communicate signals to a vehicle computer (e.g., drive by wire) which in turn may control the corresponding propulsion component of the propulsion system. As such, in some embodiments, the vehicle 10 may be an autonomous vehicle.

In some embodiments, the vehicle 10 includes a transmission in communication with a crankshaft via a flywheel or clutch or fluid coupling. In some embodiments, the transmission includes a manual transmission. In some embodiments, the transmission includes an automatic transmission. The vehicle 10 may include one or more pistons, in the case of an internal combustion engine or a hybrid vehicle, which cooperatively operate with the crankshaft to generate force, which is translated through the transmission to one or more axles, which turns wheels 22. When the vehicle 10 includes one or more electric motors, a vehicle battery, and/or fuel cell provides energy to the electric motors to turn the wheels 22.

The vehicle 10 may include automatic vehicle propulsion systems, such as a cruise control, an adaptive cruise control, automatic braking control, other automatic vehicle propulsion systems, or a combination thereof. The vehicle 10 may be an autonomous or semi-autonomous vehicle, or other suitable type of vehicle. The vehicle 10 may include additional or fewer features than those generally illustrated and/or disclosed herein.

In some embodiments, the vehicle 10 may include an Ethernet component 24, a controller area network (CAN) bus 26, a media oriented systems transport component (MOST) 28, a FlexRay component 30 (e.g., brake-by-wire system, and the like), and a local interconnect network component (LIN) 32. The vehicle 10 may use the CAN bus 26, the MOST 28, the FlexRay component 30, the LIN 32, other suitable networks or communication systems, or a combination thereof to communicate various information from, for example, sensors within or external to the vehicle, to, for example, various processors or controllers within or external to the vehicle. The vehicle 10 may include additional or fewer features than those generally illustrated and/or disclosed herein.

The vehicle 10 may include an electronic power steering (EPS) system. The EPS system may be configured to assist and/or control steering of the vehicle 10. The EPS system may include or be in communication with various sensors configured to measure various aspects of the steering system of the vehicle 10. The EPS system may include one or more controller, such as an EPS microcontroller unit (MCU), herein after referred to as the controller. The controller may include one or more a processor and associated memory. The processor(s) may include any suitable processor, such as those described herein. The memory may comprise a single disk or a plurality of disks (e.g., hard drives), and includes a storage management module that manages one or more partitions within the memory. In some embodiments, memory may include flash memory, semiconductor (solid state) memory or the like. The memory may include Random Access Memory (RAM), a Read-Only Memory (ROM), or a combination thereof. The memory may include instructions that, when executed by the one or more processors, cause the one or more processors to, at least, control various aspects of the EPS system. It should be understood that the EPS system may include any suitable number of controllers, processors, and memory.

The EPS system may include an EPS controller area network (CAN) bus. The EPS CAN bus may be in communication with a vehicle CAN bus of the vehicle 10. The vehicle CAN bus may include features similar to those of the CAN bus 26 or other suitable features. The vehicle CAN bus may communicate with various sensors within the vehicle 10 and receive various measurements from the various sensors. For example, the one or more sensors of the vehicle 10 may measure vehicle speed of the vehicle 10, vehicle yaw rate of the vehicle 10, handwheel or steering wheel angle of the vehicle 10, road wheel angle of the vehicle 10, other suitable measurements, or a combination thereof. The vehicle CAN bus may receive, from a controller of the vehicle 10, one or more signals indicating the various measurements. For example the vehicle CAN bus may receive a vehicle speed signal indicating a measured vehicle speed of the vehicle 10. The vehicle CAN bus may communicate the one or more signals to the EPS CAN bus. The EPS CAN bus may communicate the one or more signals to the ESP controller.

The controller may determine various values corresponding to the one or more signals. For example, the controller may receive a vehicle speed signal (e.g., a first vehicle speed signal) and may determine a vehicle speed value (e.g., a first vehicle speed) based on the vehicle speed signal. The controller may determine one or more assist torque values based on the various values determined from the one or more signals. The one or more assist torque values may correspond to an amount of torque to be provided to an EPS motor. The controller may selectively control the EPS motor using the one or more assist torque values. The EPS motor may be in communication with the steering system, such as a steer-by-wire system or other suitable steering system of the vehicle 10. The EPS motor, when controlled according to the one or more assist torque values, provides a steering assist to steering components of the steering system of the vehicle 10. The steering assist may reduce an amount of torque or force required by the operator of the vehicle 10 to execute a corresponding steering maneuver.

Figure 2:
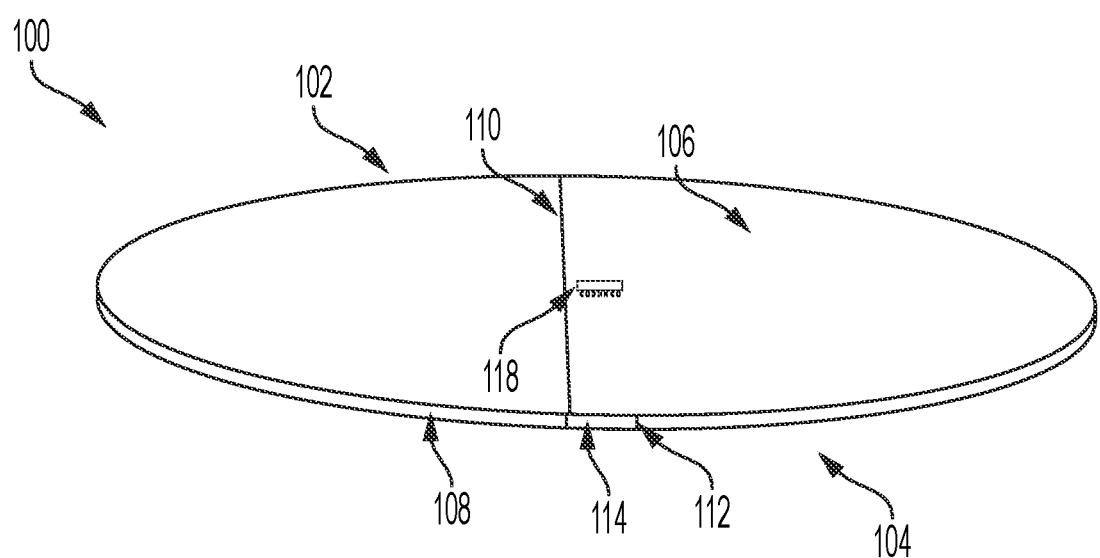
FIG. 2 generally illustrates a plan view of a printed circuit board according to the principles of the present disclosure.
Figure 3:
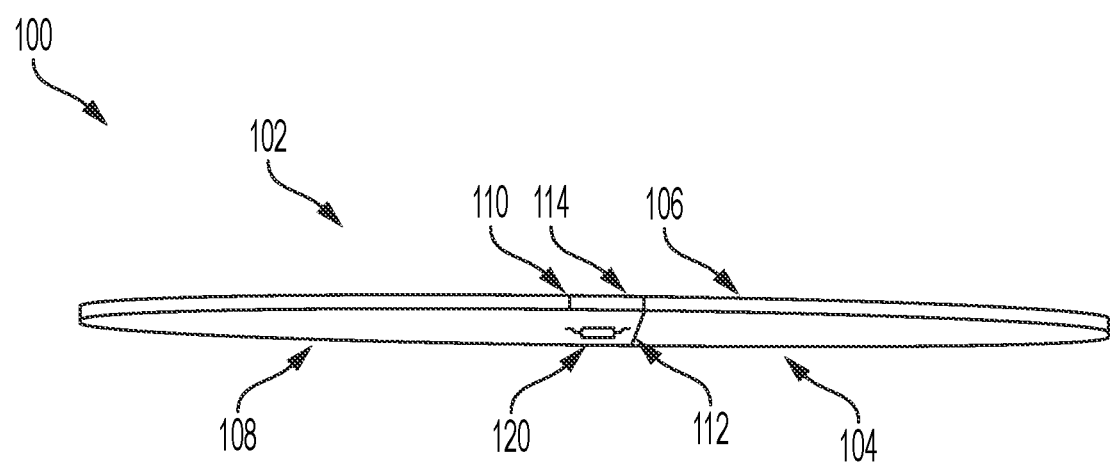
FIG. 3 generally illustrates an elevation view of a printed circuit board according to the principles of the present disclosure.

In some embodiments, the systems and methods described herein may be configured to include a printed circuit board for the EPS system controls, processors, memory, and the like, such as the printed circuit board (PCB) 100 as illustrated in FIGS. 2 and 3. The PCB 100 may include any suitable printed circuit board and comprise any suitable material. For example, the PCB 100 may include an eight layer PCB comprising either layers of the printed circuit board. However, it should be understood that the PCB 100 may include any suitable number of layers and materials.

The PCB 100 may include a first surface 102 and a second surface 104 opposite the first surface 102. The PCB 100 may include a first processor section 106 extending away from a boarder 110 in a first direction on the first surface 102. The boarder 110 may include a logical boarder defining a separation between the first processor section 106 and other processor sections of the first surface 102.

The PCB 100 may include a second processor section 108 extending away from a boarder 112 in a second direction opposite the first direction on the second surface 104. The boarder 112 may include a logical boarder defining a separation between the second processor section 108 and other processor sections of the second surface 104. The PCB 100 may include any suitable number of logically or physically separated processor sections than those described herein. In some embodiments, one or more processors may be disposed on the first processor section 106 and one or more processors may be disposed on the second processor section 108. The one or more processors of the first processor section 106 may communicate with the one or more processors of the second processor section 108. Alternatively, the one or more processors of the first processor section 106 may be completely or at least partially isolated (e.g., and not in direct and/or indirect communication with) from the one or more processors of the second processor section 108.

In some embodiments, the PCB 100 may include a void 114 (e.g., which may be referred to herein as an isolation area) disposed between the first surface 102 and the second surface 104. The void 114 may extend entirely through the PCB 100 or a through a portion of the PCB 100 extending from a first location of the PCB 100 and ending at a second location of the PCB 100. In some embodiments, the PCB 100 may include any suitable number of voids instead of or in addition to the void 114. In some embodiments, the void 114 comprises at least one of air, a vacuum, an elastomer material, a foam material, other suitable material, or a combination thereof.

Figure 6A:
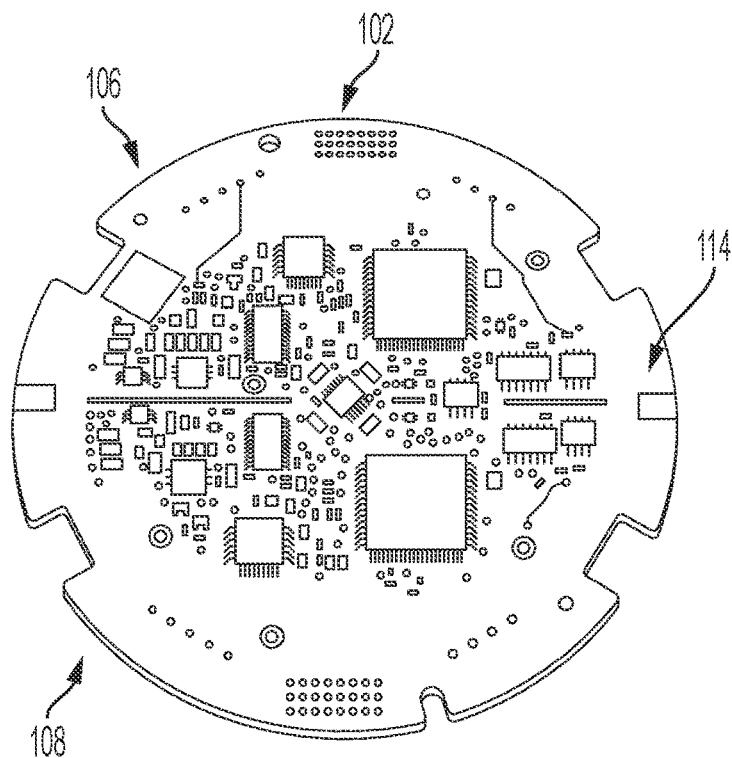
FIGS. 6A and 6B generally illustrate a printed circuit board according to the principles of the present disclosure.
Figure 6B:
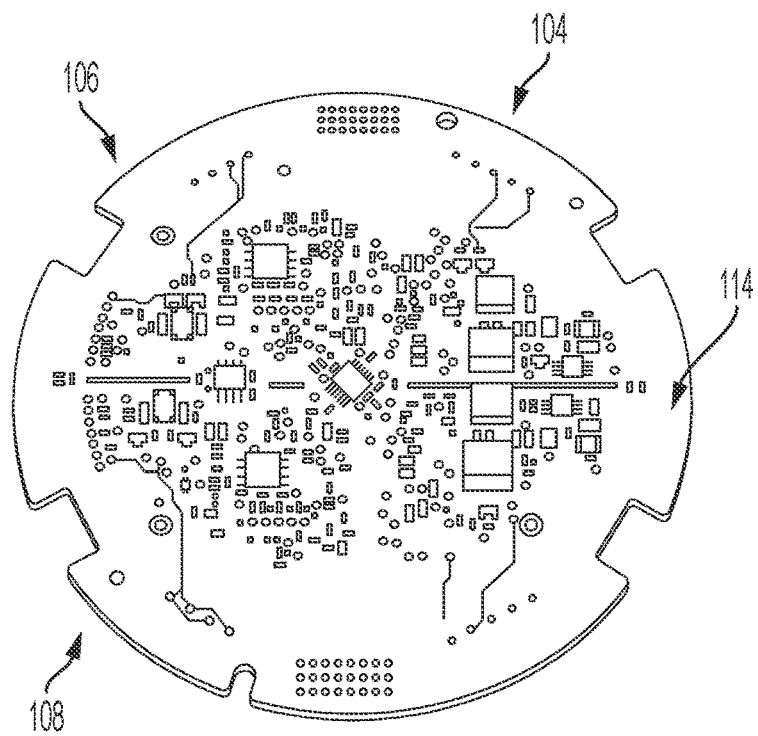

In some embodiments, the void 114 may comprising a first slot disposed on the first surface 102 and a second slot disposed on the second surface 104, as is generally illustrated in FIGS. 6A and 6B. The first slot and the second slot may be correspondingly disposed, such that the first slot is disposed on the first surface 102 directly or substantially directly above the second slot on the second surface 104. The first slot and the second slot may define channels defined by two sides and a floor (e.g., having an open side). In some embodiments, the first slot and the second slot may be milled (e.g., removing material from the first surface 102 to define the first slot and removing material from the second surface 104 to define the second slot) or manufactured using any suitable technique. In some embodiments, the first slot and/or the second slot may comprising a plurality of slots. For example, the first slot may include a first slot portion extending from a first point on the first surface 102 and ending at a second point on the first surface 102 and a second slot portion extending from a third point on the first surface 102 and ending at a fourth point on the first surface 102. It should be understood that the PCB 100 may include any suitable number of slots.

In some embodiments, the void 114 may include a slot extending from the first surface 102 through the second surface 104 (e.g. such that the PCB 100 includes an opening passing through the PCB 100). Additionally, or alternatively, the void 114 may comprising a plurality of slots. For example, the slot may include a first slot portion extending from a first point on the first surface 102 and ending at a second point on the first surface 102 and a second slot portion extending from a third point on the first surface 102 and ending at a fourth point on the first surface 102. It should be understood that the PCB 100 may include any suitable number of slots. In some embodiments, the void 114 and may be milled (e.g., removing material from PCB 100) or manufactured using any suitable technique.

Figure 4:
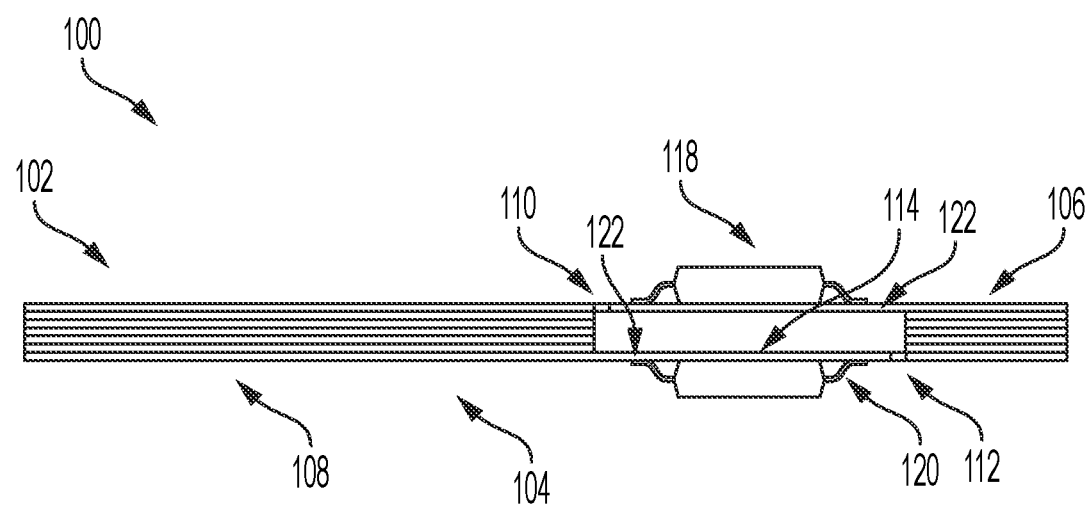
FIG. 4 generally illustrates a cutaway view of a printed circuit board according to the principles of the present disclosure.
Figure 5:
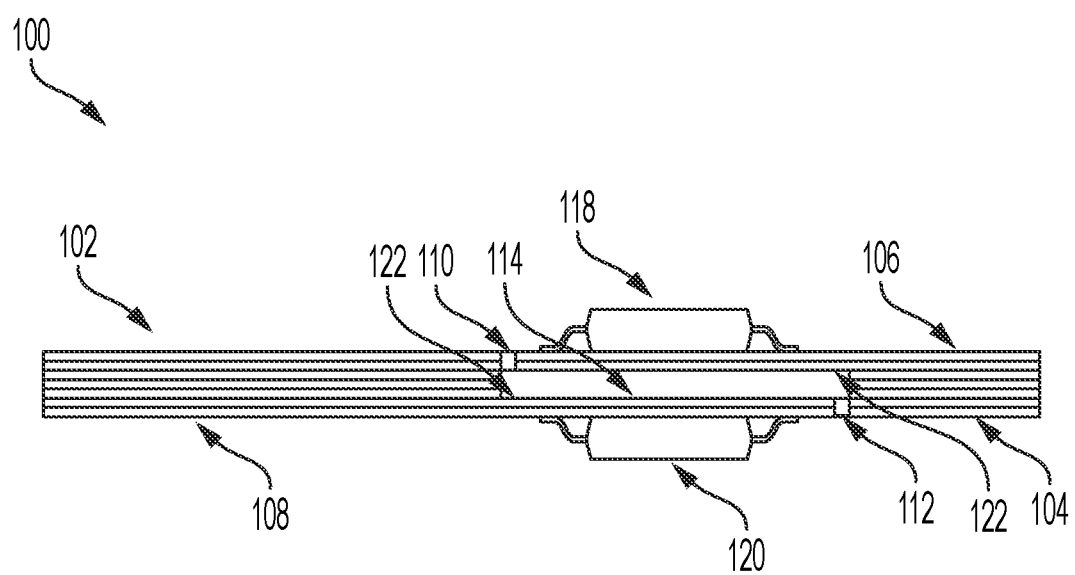
FIG. 5 generally illustrates a cutaway view of a printed circuit board according to the principles of the present disclosure.

In some embodiments, the void 114 defines one or more flexible sections 122 of the PCB 100, as is generally illustrated in FIGS. 4 and 5. As illustrated, the void 114 may define two flexible sections 122. However, the PCB 100 may include a plurality of void including and/or in addition to the void 114 defining any suitable number of flexible sections 122 or other suitable flexible sections.

In some embodiments, each flexible section 122 may include dielectric material and/or conductor. For example, as is generally illustrated in FIG. 4, a flexible section 122 corresponding to the first surface 102 and a flexible section 122 corresponding to the second surface 104 may include one layer of dielectric material and one layer of conductive material. The dielectric material may include any suitable dielectric material, such as porcelain, mica, glass, plastic, one or more metal oxides, any other suitable dielectric material, or a combination thereof. The conducive material may include any suitable conductive material, such as copper, aluminum, iron, any other suitable conductive material, or a combination thereof. As described, the PCB 100 may include an eight layer PCB or any suitable PCB having any suitable number of layer.

In some embodiments, each flexible section 122 may include two layers of dielectric material and two layers of conductor, as is generally illustrated in FIG. 5. It should be understood that the flexible sections 122 may include any suitable number of dielectric layers and any suitable number of conductors. By increasing or decreasing the number of dielectric layers and conductors of the flexible sections 122, the flexible sections 122 may provide more or less mechanical flexibility and more or fewer layers of circuity both within and between the processors corresponding to respective ones of the first processor section 106 and the second processor section 108 (e.g., or any suitable processor section). Additionally, or alternatively, the mechanical isolation provided by the flexible sections 122 and/or the void 114 may reduce the occurrence common cause failures. For example, stress acting on the first surface 102 that may damage circuity connected to the first surface 102, may not damage the circuity connected to the second surface 104 (e.g., due to the mechanical isolation caused by the void 114). Additionally, or alternatively, stress acting on the first processor section 106 that may damage circuity connected to the first processor section 106 may not damage circuity connected to the second processor section 108 because the flexible sections 122 may absorb the stress and prevent the stress from translating from one processor section to the other.

In some embodiments, the void 114 is disposed between the first surface 102 and the second surface 104 between two sensor circuits. For example, as is generally illustrated in FIGS. 2 and 3, a first sensor 118 may be disposed on a portion of the first surface 102 corresponding to the first processor section 106 and a second sensor 120 may be disposed on a portion of the second surface 104 corresponding to the second processor section 108. It should be understood that the first sensor 118 and/or the second sensor 120 may comprise any suitable sensor, such as a motor position sensor, or other suitable sensor. For example, at least one of the first sensor 118 and the second sensor 120 may include a position sensor configured to measure or sense a position of a motor the EPS system of the vehicle 10. The position of the motor of the EPS system may be used by a controller of the vehicle 10 to control various aspects of the vehicle 10, including, using the EPS system, aspects of steering the vehicle 10. Additionally, or alternatively, the first sensor 118 and the second sensor 120 may be different types of sensors.

In some embodiments, the first sensor 118 and/or the second sensor 120 may include an on-axis motor position sensor. A sense magnet of the position sensor may include a single axis of rotation. Sensing elements for the one or more processors of the first processor section 108 and one or more processors of the second processor section 120 may, accordingly, be disposed on a common axis (e.g., which may provide for symmetry about the sense magnet axis). Additionally, or alternatively, the PCB 100 may be remotely disposed from the sense magnet of the first sensor 118 and/or the second sensor 120 (e.g., on or near a side of a motor, for example). Additionally, or alternatively, the first sensor 118 and/or the second sensor 120 may include an off-axis sensor and the first sensor 118 may be disposed on the first processor section 106 and the second senor 120 may be disposed on the second processor section 108 (e.g., located over different portions of a ring magnet).

In some embodiments, the PCB 100 may include one or more isolation devices instead of or in addition to one or both of the first sensor 118 and the second sensor 120 (e.g., proximate to the void 114). As described, the first sensor 118 may be isolated from the second sensor 120 by the void 114. Additionally, or alternatively, the first sensor 118 and the second sensor 120 may be mechanically isolated from one another by the void 114 and/or the flexible sections 122.

In some embodiments, one or more components that are functionally shared by a processor associated with the first processor section 106 and a processor associated with the second processor section 108 (e.g., in addition to or instead of the first sensor 118 and/or the second sensor 120). For example, one or more elements or components of inter-processor communication hardware such, as printed circuit traces, resistors, isolation circuits, and the like, may be physically located in the void 114.

In some embodiments, an apparatus that includes a printed circuit board having: a first surface and a second surface opposite the first surface; a first processor section extending in a first direction on the first surface; a second processor section extending in a second direction opposite the first direction on the second surface; and a void disposed between the first surface and the second surface, the first processor section and the second processor section being separated by the void. The apparatus also includes a first sensor disposed on a portion of one of the first processor section and the second processor section corresponding to the void.

In some embodiments, the void defines a flexible section of the printed circuit board. In some embodiments, the void comprises one or more of air, a vacuum, an elastomer material, and a foam material. In some embodiments, the first sensor includes a position sensor. In some embodiments, the apparatus also includes a second sensor disposed on a portion of the other of the first processor section and the second processor section corresponding to the void. In some embodiments, a portion of the void defined by the first surface includes at least one layer of dielectric material. In some embodiments, a portion of the void defined by the second surface includes at least one layer of dielectric material. In some embodiments, a portion of the void defined by the first surface includes at least one layer of conductive material. In some embodiments, a portion of the void defined by the second surface includes at least one layer of conductive material. In some embodiments, the printed circuit board includes an eight layer printed circuit board. In some embodiments, the void extends from a first location on the printed circuit board to a second location on the printed circuit board. In some embodiments, the printed circuit board is associated with a steering system of a vehicle. In some embodiments, the first sensor is configured to measure a positon of a motor.

In some embodiments, a printed circuit board includes a first surface and a second surface opposite the first surface. The printed circuit board also includes a first processor section extending in a first direction on the first surface and a second processor section extending in a second direction opposite the first direction on the second surface. The printed circuit board also includes a void disposed between the first surface and the second surface, the first processor section and the second processor section being separated by the void and defining a flexible section comprising at least one layer of dielectric material and at least one layer of conductive material. The printed circuit board also includes a first sensor disposed on a portion of one of the first processor section and the second processor section corresponding to the void.

In some embodiments, the void comprises one or more of air, a vacuum, an elastomer material, and a foam material. In some embodiments, the first sensor includes a position sensor. In some embodiments, the printed circuit board also includes a second sensor disposed on a portion of the other of the first processor section and the second processor section corresponding to the void. In some embodiments, the void extends from a first location on the printed circuit board to a second location on the printed circuit board. In some embodiments, the first sensor is configured to measure a positon of a motor.

In some embodiments, a steering system for a vehicle includes a printed circuit board having: a first surface and a second surface opposite the first surface; a first processor section extending in a first direction on the first surface; a second processor section extending in a second direction opposite the first direction on the second surface; and a void disposed between the first surface and the second surface, the first processor section and the second processor section being separated by the void and defining a flexible section comprising at least one layer of dielectric material and at least one layer of conductive material. The steering system also includes a position sensor disposed on a portion of one of the first processor section and the second processor section corresponding to the void, the position sensor being configured to measure a positon of an associated motor.

In some embodiments, an apparatus includes a printed circuit board having: a first surface and a second surface opposite the first surface; a first processor section extending in a first direction on the first surface; a second processor section extending in a second direction opposite the first direction on the second surface; and a void disposed between the first surface and the second surface, the first processor section and the second processor section being separated by the void.

In some embodiments, the void defines a flexible section of the printed circuit board. In some embodiments, the void comprises one or more of air, a vacuum, an elastomer material, and a foam material. In some embodiments, the apparatus also includes a first sensor disposed on a portion of one of the first processor section and the second processor section corresponding to the void. In some embodiments, the first sensor is configured to measure a positon of a motor. In some embodiments, the apparatus also includes a second sensor disposed on a portion of the other of the first processor section and the second processor section corresponding to the void. In some embodiments, a portion of the void defined by the first surface includes at least one layer of dielectric material. In some embodiments, a portion of the void defined by the second surface includes at least one layer of dielectric material. In some embodiments, a portion of the void defined by the first surface includes at least one layer of conductive material. In some embodiments, a portion of the void defined by the second surface includes at least one layer of conductive material. In some embodiments, the printed circuit board includes an eight layer printed circuit board. In some embodiments, the void extends from a first location on the printed circuit board to a second location on the printed circuit board. In some embodiments, the printed circuit board is associated with a steering system of a vehicle.

In some embodiments, a printed circuit includes a first surface and a second surface opposite the first surface, a first processor section extending in a first direction on the first surface, a second processor section extending in a second direction opposite the first direction on the second surface, and a void disposed between the first surface and the second surface, the first processor section and the second processor section being separated by the void and defining a flexible section comprising at least one layer of dielectric material and at least one layer of conductive material.

In some embodiments, the void comprises one or more of air, a vacuum, an elastomer material, and a foam material. In some embodiments, the printed circuit board also includes a first sensor disposed on a portion of one of the first processor section and the second processor section corresponding to the void. In some embodiments, the printed circuit board also includes a second sensor disposed on a portion of the other of the first processor section and the second processor section corresponding to the void. In some embodiments, the void extends from a first location on the printed circuit board to a second location on the printed circuit board. In some embodiments, the printed circuit board also includes at least one inter-processor communication mechanism disposed on a portion of one of the first processor section and the second processor section corresponding to the void.

In some embodiments, a steering system for a vehicle includes a printed circuit board having: a first surface and a second surface opposite the first surface; a first processor section extending in a first direction on the first surface; a second processor section extending in a second direction opposite the first direction on the second surface; and an isolation area comprising a slot disposed in the first surface and extending through the second surface, the first processor section and the second processor section being separated by the isolation area, the isolation area defining a flexible section comprising at least one layer of dielectric material and at least one layer of conductive material.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present disclosure and do not limit the present disclosure. On the contrary, the disclosure is intended to cover various modifications and equivalent arrangements included within the scope of the appended claims, which scope is to be accorded the broadest interpretation to encompass all such modifications and equivalent structure as is permitted under the law.

Having thus described the invention, it is claimed:
1. An apparatus comprising:
   a printed circuit board having:
      a first surface and a second surface opposite the first surface;
      a first processor section extending in a first direction on the first surface;
      a second processor section extending in a second direction opposite the first direction on the second surface; and
      a void disposed between the first surface and the second surface and extending from a side of the first surface to a side of the second surface that faces the side of the first surface, the first processor section and the second processor section being separated by the void, wherein the first processor section extends from a first boarder of the void in the first direction on the first surface, and wherein the second processor section extends from a second boarder on an opposite side of the void from the first boarder in the second direction on the second surface.

2. The apparatus of claim 1, wherein the void defines a flexible section of the printed circuit board.

3. The apparatus of claim 1, wherein the void comprises one or more of air, a vacuum, an elastomer material, and a foam material.

4. The apparatus of claim 1, further comprising a first sensor disposed on a portion of one of the first processor section and the second processor section corresponding to the void.

5. The apparatus of claim 4, wherein the first sensor is configured to measure a positon of a motor.

6. The apparatus of claim 4, further comprising a second sensor disposed on a portion of the other of the first processor section and the second processor section corresponding to the void.

7. The apparatus of claim 1, wherein a portion of the void defined by the first surface includes at least one layer of dielectric material.

8. The apparatus of claim 1, wherein a portion of the void defined by the second surface includes at least one layer of dielectric material.

9. The apparatus of claim 1, wherein a portion of the void defined by the first surface includes at least one layer of conductive material.

10. The apparatus of claim 1, wherein a portion of the void defined by the second surface includes at least one layer of conductive material.

11. The apparatus of claim 1, wherein the printed circuit board includes an eight layer printed circuit board.

12. The apparatus of claim 1, wherein the void extends from a first location on the printed circuit board to a second location on the printed circuit board.

13. The apparatus of claim 1, wherein the printed circuit board is associated with a steering system of a vehicle.

14. A printed circuit board comprising:
   a first surface and a second surface opposite the first surface;
   a first processor section extending in a first direction on the first surface;
   a second processor section extending in a second direction opposite the first direction on the second surface; and
   a void disposed between the first surface and the second surface and extending from a side of the first surface to a side of the second surface that faces the side of the first surface, the first processor section and the second processor section being separated by the void and defining a flexible section comprising at least one layer of dielectric material and at least one layer of conductive material, wherein the first processor section extends from a first boarder of the void in the first direction on the first surface, and wherein the second processor section extends from a second boarder on an opposite side of the void from the first boarder in the second direction on the second surface.

15. The printed circuit board of claim 14, wherein the void comprises one or more of air, a vacuum, an elastomer material, and a foam material.

16. The printed circuit board of claim 14, further comprising a first sensor disposed on a portion of one of the first processor section and the second processor section corresponding to the void.

17. The printed circuit board of claim 16, further comprising a second sensor disposed on a portion of the other of the first processor section and the second processor section corresponding to the void.

18. The printed circuit board of claim 14, wherein the void extends from a first location on the printed circuit board to a second location on the printed circuit board.

19. The printed circuit board of claim 14, further comprising at least one inter-processor communication mechanism disposed on a portion of one of the first processor section and the second processor section corresponding to the void.

20. A steering system for a vehicle comprising:
a printed circuit board having:
- a first surface and a second surface opposite the first surface;
- a first processor section extending in a first direction on the first surface;
- a second processor section extending in a second direction opposite the first direction on the second surface; and
- an isolation area comprising a slot and extending from a side of the first surface to a side of the second surface that faces the side of the first surface, the first processor section and the second processor section being separated by the isolation area, the isolation area defining a flexible section comprising at least one layer of dielectric material and at least one layer of conductive material, wherein the first processor section extends from a first boarder of the isolation area in the first direction on the first surface, and wherein the second processor section extends from a second boarder on an opposite side of the isolation area from the first boarder in the second direction on the second surface.

* * * * *